United States Patent
Bailey et al.

(10) Patent No.: US 10,674,638 B2
(45) Date of Patent: Jun. 2, 2020

(54) FAIL-ON COOLING SYSTEM

(71) Applicant: Dell Products L.P., Round Rock, TX (US)

(72) Inventors: Mark M. Bailey, Round Rock, TX (US); Trey S. Wiederhold, Cedar Park, TX (US); Tyler B. Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 228 days.

(21) Appl. No.: 15/417,127

(22) Filed: Jan. 26, 2017

(65) Prior Publication Data

US 2018/0213684 A1    Jul. 26, 2018

(51) Int. Cl.
*H05K 7/20* (2006.01)
*F25B 49/02* (2006.01)

(52) U.S. Cl.
CPC ....... *H05K 7/20836* (2013.01); *F25B 49/022* (2013.01); *H05K 7/20827* (2013.01); *F25B 2400/06* (2013.01); *F25B 2600/02* (2013.01)

(58) Field of Classification Search
CPC .. F25B 1/10; F25B 5/02; F25B 49/022; F25B 2400/06; F25B 2400/061; F25B 2400/075; F25B 2400/0751; F25B 2600/02; F25B 2600/022; F25B 2600/0253; H05K 7/20827; H05K 7/20354; H05K 7/20836
See application file for complete search history.

(56) References Cited

U.S. PATENT DOCUMENTS

| | | | |
|---|---|---|---|
| 4,152,902 A * | 5/1979 | Lush | F25B 49/022 236/1 E |
| 4,903,759 A | 2/1990 | Lapeyrouse | |
| 5,570,585 A * | 11/1996 | Vaynberg | F25B 49/022 62/175 |
| 5,853,123 A * | 12/1998 | Okano | H04L 12/2838 236/51 |
| 6,574,104 B2 | 6/2003 | Patel et al. | |
| 7,237,405 B2 * | 7/2007 | Takegami | F25B 13/00 62/498 |
| 7,287,395 B2 * | 10/2007 | Nash, Jr. | F25B 49/022 62/175 |
| 7,373,268 B1 | 5/2008 | Viredaz et al. | |

(Continued)

*Primary Examiner* — Eric S Ruppert
*Assistant Examiner* — Hans R Weiland
(74) *Attorney, Agent, or Firm* — Norton Rose Fulbright US LLP

(57) ABSTRACT

One technique for improving cooling system efficiency is to operate cooling for a data center with a dynamic and distributed cooling system. A distributed cooling system may include multiple compressors operating cooperatively for cooling the data center. A dynamic cooling system may adjust operation of the compressors based on one or more parameters, such as inside temperature, outdoor temperature, inside humidity, outside humidity, and load on the data center. A dynamic cooling system may operate in a fail-on mode, adjusting the load placed on independent refrigeration circuits of an air handler system to compensate for a failure of one or more refrigeration circuits. By appropriately controlling speeds of the compressors, the power efficiency of the cooling system may be improved by ensuring that all activated compressors are operating within their efficient operating range.

18 Claims, 8 Drawing Sheets

(56) References Cited

U.S. PATENT DOCUMENTS

| | | | | |
|---|---|---|---|---|
| 7,617,695 | B2* | 11/2009 | Shapiro | F25B 49/022 62/175 |
| 8,042,348 | B2* | 10/2011 | Nishikawa | F25B 49/005 62/126 |
| 8,514,572 | B2 | 8/2013 | Rogers | |
| 8,881,541 | B2* | 11/2014 | Noll | F25B 49/02 62/225 |
| 2015/0027139 | A1* | 1/2015 | Lin | F25B 49/02 62/56 |
| 2016/0061207 | A1* | 3/2016 | Penn, II | F04B 35/04 417/44.1 |
| 2018/0022184 | A1* | 1/2018 | Ohyama | B60L 1/003 62/231 |

\* cited by examiner

FAIL-ON COOLING SYSTEM

FIELD OF THE DISCLOSURE

The instant disclosure relates to data centers. More specifically, portions of this disclosure relate to cooling systems for data centers.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The variety of hardware components that may be configured to operate as an information handling system are conventionally installed in dedicated information technology (IT) equipment space along with necessary support and backup systems. Such equipment space may include racks of information technology (IT) equipment. Support systems for the IT equipment may also be located in the equipment space, such as power subsystems and backup batteries.

All of this IT equipment in one confined space can generate significant heat. Further, IT equipment can be sensitive to high temperatures. For example, computer microprocessors have a maximum safe temperature for operation. Although that safe temperature may be a very high temperature in comparison to even the hottest of rooms, the processor relies on the room air to absorb heat from the processor during operation to keep the processor's temperature within a safe range. As the room temperature increases, the room air is less able to cool the processor. Eventually, the processor decreases its performance when the maximum temperature is reached. If the processor remains unable reduce temperature due to high room temperatures, the processor may shut down completely or become damaged by the high heat.

Thus, the equipment space also conventionally includes dedicated cooling units to maintain the room's temperature and humidity within safe ranges. Dedicated, or any other, cooling units can offset the heat generated by the high density of IT equipment in the confined space, and assist with maintaining safe operation of the processors. However, dedicated cooling units consume significant amounts of power. In a large data center, the power consumed by cooling systems may be a majority or even a large majority of total power consumed. This large power consumption is wasted, in part, because the dedicated cooling units are conventionally designed to operate at cooling rates that exceed that necessary to keep the IT equipment in safe operating ranges. This is particularly true when the IT equipment is operating at a low load condition and thus the needed cooling is low. With dedicated cooling units, conventionally the cooling units switch on and off as needed to maintain a desired temperature. These cooling units are sized to match a maximum load on the IT equipment. Thus, the cooling units provide far more cooling that is needed by the IT equipment.

SUMMARY

Higher efficiency operation of data centers may lead to lower operating costs. One technique for providing improved efficiency is to operate cooling units for a data center or portion of a data center with a dynamic and distributed cooling system. A distributed cooling system may include multiple compressors operating cooperatively for cooling a confined space, such as a data center. A dynamic cooling system may adjust operation of a compressor based on one or more parameters, such as inside temperature, outdoor temperature, inside humidity, outside humidity, and load on the data center. By appropriately controlling a dynamic, distributed cooling system, the power efficiency of a cooling system for a data center may be improved. In one embodiment, a dynamic, distributed cooling system may be controlled to obtain an approximately linear power consumption as a function of load. In contrast, a conventional cooling system generally has a non-linear power consumption as a function of load, and instead exhibit stair-step power consumption as operating modes of the cooling system change.

Multiple compressors may be operated in such a manner to provide a cooling capacity that has an approximately linear relationship to power consumption. In one configuration, a cooling system may include multiple compressors coupled in parallel in a refrigeration circuit. The compressors may be controlled to operate at different speeds within their operational limits to provide an operating range over which the cooling capacity of the collective compressors is approximately linear with respect to power consumption. A refrigeration circuit may refer to a plurality of compressors that share a closed-loop piping circuit of refrigerant. In another configuration, a cooling system may include multiple compressors coupled in parallel on two or more refrigerant circuits.

Many mechanical and electrical systems are designed as fail off systems: that is, the systems are designed to shut down when a failure is detected. For example, if a computer begins to overheat, processes may be put in motion that will lead to a shutdown in order to prevent the failure from damaging the system or external entities. However, in some applications use of fail-off systems can lead to detrimental outcomes. If a failure is detected in a critical system, a fail-off system may cause more damage by shutting the system down than continued operation would have caused, particularly if the failure was a temporary failure or a false positive of a failure condition. Air handler systems are one example of a system where a premature shut-off may cause more harm than good. In many air handler systems, the system is designed to deactivate upon detection of a failure. This can lead to undesirable overheating of information handling systems being cooled by the air handler systems or a need for multiple air handler systems in a single facility to ensure redundancy.

Multiple independent refrigeration circuits of an air handler system may be connected in parallel to provide redundant, fail-on cooling capabilities to an air handler system. The system may be configured to detect a failure of a refrigeration circuit and alter the operation of a parallel refrigeration circuit to satisfy a full load or portion of a load that was satisfied by the failed refrigeration circuit. This fail-on management of the air handler system allows the air handler system to use the multiple independent refrigeration circuits to remain on, rather than shut off, when an indication is received of a failure of a part of the air handler system.

One example scenario where adjusting individual speeds within a plurality of compressors may achieve higher efficiency is when one compressor would be operating inefficiently to satisfy a large cooling load, but multiple compressors could work in parallel to satisfy the load while each compressor is in its efficient operating range. Conventional systems would operate the single compressor at a fixed level and, when necessary, activate a different compressor at a fixed level, as described with reference to FIG. 1 below. Instead, the individual speeds of multiple compressors may be adjusted to maintain each compressor in an efficient range of operation while satisfying the cooling requirement. For example, an additional compressor may be activated to reduce the load on the first compressor. The additional compressor may be activated at a speed within its efficient operating range. When the low point of the efficient operating range for the additional compressor provides more cooling capacity than required, the first compressor speed may be reduced to return the first compressor to its efficient operating range. When the low point of the efficient operating range for the additional compressor does not provide sufficient cooling capacity, the starting speed of the additional compressor may be increased until the required cooling capacity is achieved. The starting speed of the additional compressor may be further increased to obtain sufficient cooling capacity such that the first compressor may be reduced in speed back to an efficient operating range.

According to one embodiment, an apparatus may include a plurality of compressors coupled in parallel and configured to provide cooling to a confined space, such as a data center. The apparatus may also include a controller coupled to the plurality of compressors and configured to control speeds of each of the individual compressors of the plurality of compressors.

In certain embodiments, the controller may perform steps including receiving an indication of a first cooling load and activating a first compressor of the plurality of compressors at a first output level to meet a demand of the first cooling load. Then, the controller may receive an indication of a second cooling load higher than the first cooling load. The first compressor may have sufficient capacity to satisfy the second cooling load, but such a load may place the first compressor outside of its efficient operating range. In response, the controller may activate a second compressor at a speed within its efficient operating range. The controller may then control speeds of the first and second compressors to obtain a cooling capacity sufficient to meet the second cooling load. One manner of satisfying the second cooling load is to increase the speed of the first compressor to obtain additional cooling capacity, such that the additional capacity of the first compressor and the capacity of the second compressor at its lowest efficient operating speed is sufficient to satisfy the second cooling load. Another manner of satisfying the second cooling load is to decrease the speed of the first compressor to maintain the first compressor within its efficient operating range, such that the capacity of the second compressor at its operating speed with the decreased capacity of the first compressor is sufficient to satisfy the second cooling load.

In certain embodiments, the controller may perform steps including receiving an indication of a new second cooling load higher than a current first cooling load; determining that the second cooling load is higher than an achievable cooling capacity of a currently-activated set of compressors while maintaining the currently-active set of compressors within an efficient operating range of the currently-activated set of compressors; activating an additional compressor at an output level within an efficient operating range of the second compressor; and adjusting speeds of the currently-activated set of compressors and the additional compressor to satisfy the second cooling load while maintaining each compressor of the currently-activated set of compressors and the additional compressor within an efficient operating range for each of the compressors.

According to another embodiment, an apparatus may include a plurality of independent refrigeration circuits in an air handler system. The plurality of refrigeration circuits may be connected in parallel. Each refrigeration circuit of the plurality of refrigeration circuits may include a compressor, a controller configured to control the compressor, and a piping system separate and distinct from the piping systems of the other refrigeration circuits. Thus, if a controller, compressor, or piping system of a single refrigeration circuit experiences a failure, the other circuits may continue to function in a redundant fail-on system. The apparatus may also include a primary controller configured to control the plurality of independent refrigeration circuits. The primary controller may be configured to control the individual controllers of each independent refrigeration circuit.

In certain embodiments, the controller may be configured to perform steps including activating a first refrigeration circuit of the plurality of independent refrigeration circuits of the air handler system at a first output level and detecting a failure of the first refrigeration circuit. After a failure is detected, the controller may adjust an output of a second refrigeration circuit of the plurality of independent refrigeration circuits of the air handler system to compensate for the failure of the first refrigeration circuit and satisfy a full load or at least a portion of a load that was satisfied by the first refrigeration circuit prior to the failure. The step of activating a first refrigeration circuit at a first output level may include activating the first refrigeration circuit to meet a cooling demand of a data center of an information handling system. In some embodiments, the second refrigeration circuit may be kept in an inactive state, and, to satisfy a full load or at least a portion of the load, the second refrigeration circuit may be activated.

In certain embodiments, the step of activating the first refrigeration circuit at a first output level may include receiving an indication of a first cooling load and activating the first compressor at the first output level to meet the demand of the first cooling load. The loads of the refrigeration circuits of the air handler system may be balanced to allow the circuits to operate in efficient operating regions under various load conditions. Furthermore, each individual refrigeration circuit may contain a plurality of compressors, and the loads placed on the individual compressors may also be balanced to allow each compressor to each operate in an efficient operating region under various load conditions.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
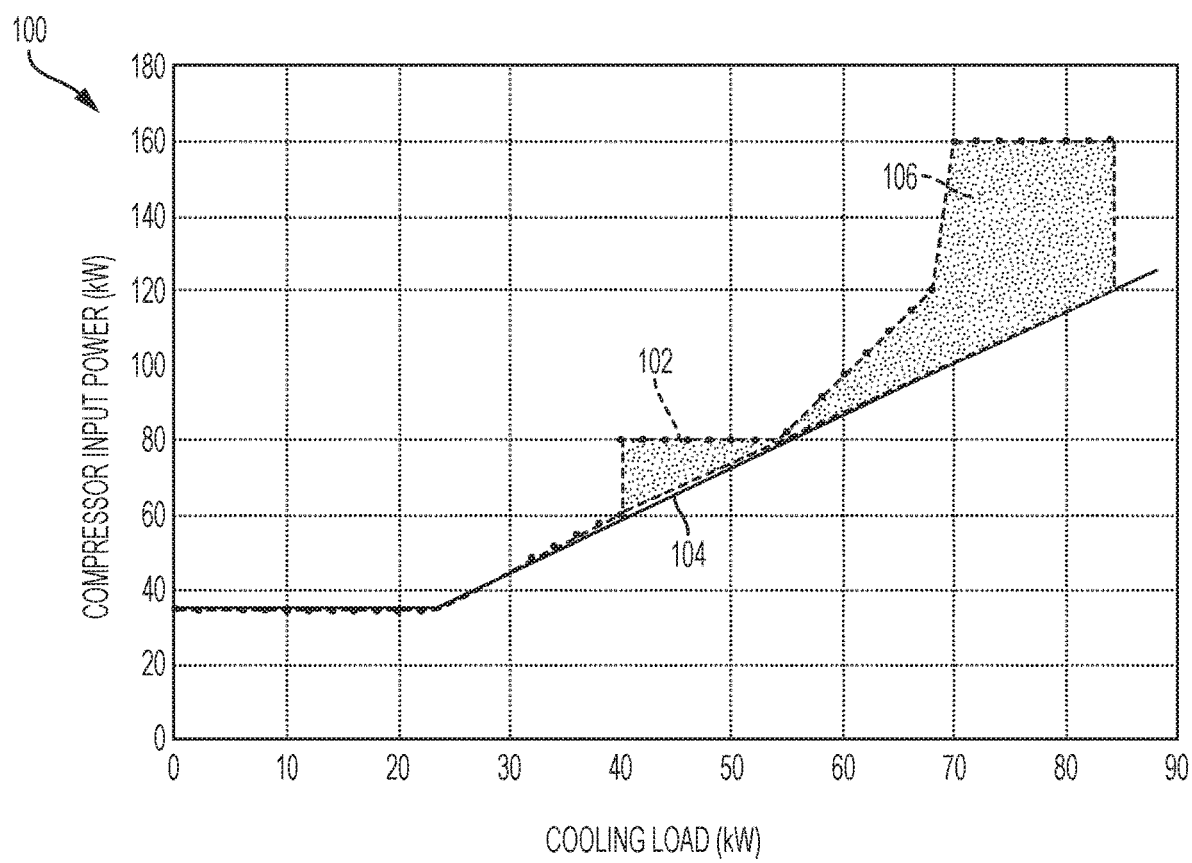
FIG. 1 is a graph illustrating power consumption during operation of a cooling system across a range of cooling loads according to some embodiments of the disclosure.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling systems also include cooling systems that cool the various pieces of IT equipment that make up the information handling systems. Parts of, or all of, an information handling system may be located in a data center. A data center may be located in a confined space with a controlled environment. The environment may be monitored and cooling systems may be controlled to regulate environmental conditions inside the data center to certain specifications. For example, a temperature and/or a humidity of the data center may be monitored and the cooling systems controlled, such as by activating, de-activating, and adjusting operating parameters thereof, to keep the temperature and the humidity in a desired range. Further, outdoor conditions may be monitored and used as part of a control system for the cooling systems.

The cooling systems for an information handling system may include direct expansion compressors operating alone or in combination with other types of cooling systems. For example, the direct expansion compressors may operate along with evaporative cooling systems, passive cooling systems, and/or mixing chambers. The cooling system may be reconfigured by a controller of the cooling system to use direct expansion compressors during certain operating modes and use other cooling systems during other operating modes. An example reconfigurable cooling system is described in U.S. patent application Ser. No. 15/184,861 entitled "Mixing Chamber for Air Handling in an Information Handling System" filed on Jun. 14, 2016, which is incorporated by reference. Although examples of reconfigurable cooling systems are described, embodiments of the invention are not limited to cooling systems having mixed devices. In some embodiments, a cooling system for an information handling system may include only direct expansion compressors. In other embodiments, a cooling system for an information handling system may utilize evaporative cooling methods.

Direct expansion compressors have operating characteristics, such as minimum input power, maximum output power, and an efficiency curve characterizing an amount of cooling power (in kilowatts) provided as a ratio of input power (in kilowatts). When operating direct expansion compressors, it is desirable to always operate compressors at an optimum ratio of cooling power to input power. Conventionally, a cooling system includes direct expansion compressors that provide more cooling than an actual heat load requires, and the compressors are cycled on and off to obtain the desired environmental conditions in a confined space. Such operation is similar to the approach used in residential cooling systems, in which the indoor temperature rises until a threshold is reached, at which time the home air conditioning system is activated to reduce the temperature until a desired temperature is reached and the air conditioning system is de-activated. In such a configuration, the compressors are sized to handle the maximum cooling load. However, during a significant amount of operating time of an information handling system, the maximum cooling capability is not required. Embodiments of the invention described herein may provide an on-demand cooling system with variable capacity over a wide range of cooling loads. In some embodiments, an approximately linear response between input power and cooling power may be achieved, such that a cooling system is able to respond to changes in demand for cooling power without losing efficiency. By keeping the cooling system operating at high efficiency, energy costs for operating the cooling system, and by extension the information handling system, may be reduced. Because a significant amount of the costs of operating an information handling system is the power consumed by the cooling system, increased efficiency of the cooling system may have a large impact in reducing operating costs for an information handling system.

FIG. 1 is a graph illustrating power consumption during operation of a cooling system across a range of cooling loads according to some embodiments of the disclosure. A graph 100 illustrates cooling load (in kilowatts) on the x-axis versus consumed power (in kilowatts) on the y-axis. A conventional loading and unloading efficiency curve of a cooling system is shown as line 102, and includes various steps in consumed power. Line 102 may represent a conventional cooling system with two compressors, in which the second compressor is activated after a first compressor is fully loaded. These two compressors conventionally operate at the same speed. Due to the limitations of the compressors, using this approach creates the stair-stepped curve resulting from the activating of the second compressor and then ramping down the first compressor.

A controller may implement variable capacity control of parallel direct expansion compressors within a single refrigeration circuit to optimize a loading and unloading efficiency curve of a cooling system containing the parallel compressors. Compressors have a limited range where capacity control may be achieved by varying the speed. A controller may control the capacity (e.g., loading/unloading) of a single compressor within its operational limits for efficient operation. For example, the controller may activate a second compressor prior to the first compressor being fully loaded. More specifically, when capacity reaches an optimal point on the efficiency curve for the first compressor, the controller may activate the second compressor at an operating point within the second compressors operational limits for efficient operation. Compressors have the ability to run at different speeds within the operational limits to extend the linear capacity range of the cooling system. When the speeds of the compressors are controlled, the loading and unloading efficiency curve of line 104 may be obtained. Embodiments described below provide methods and systems for controlling the compressors to achieve efficiency similar to that of line 104. The improved efficiency results in a net operational capacity savings over the capacity range of the cooling system shown by shaded region 106. The shaded region 106 is the difference between consumed power of a conventional cooling system shown in line 102 and the consumed power of a cooling system in embodiments of the invention shown in line 104. This shaded region 106 illustrates the cost savings obtained with embodiments of this invention.

Figure 2:
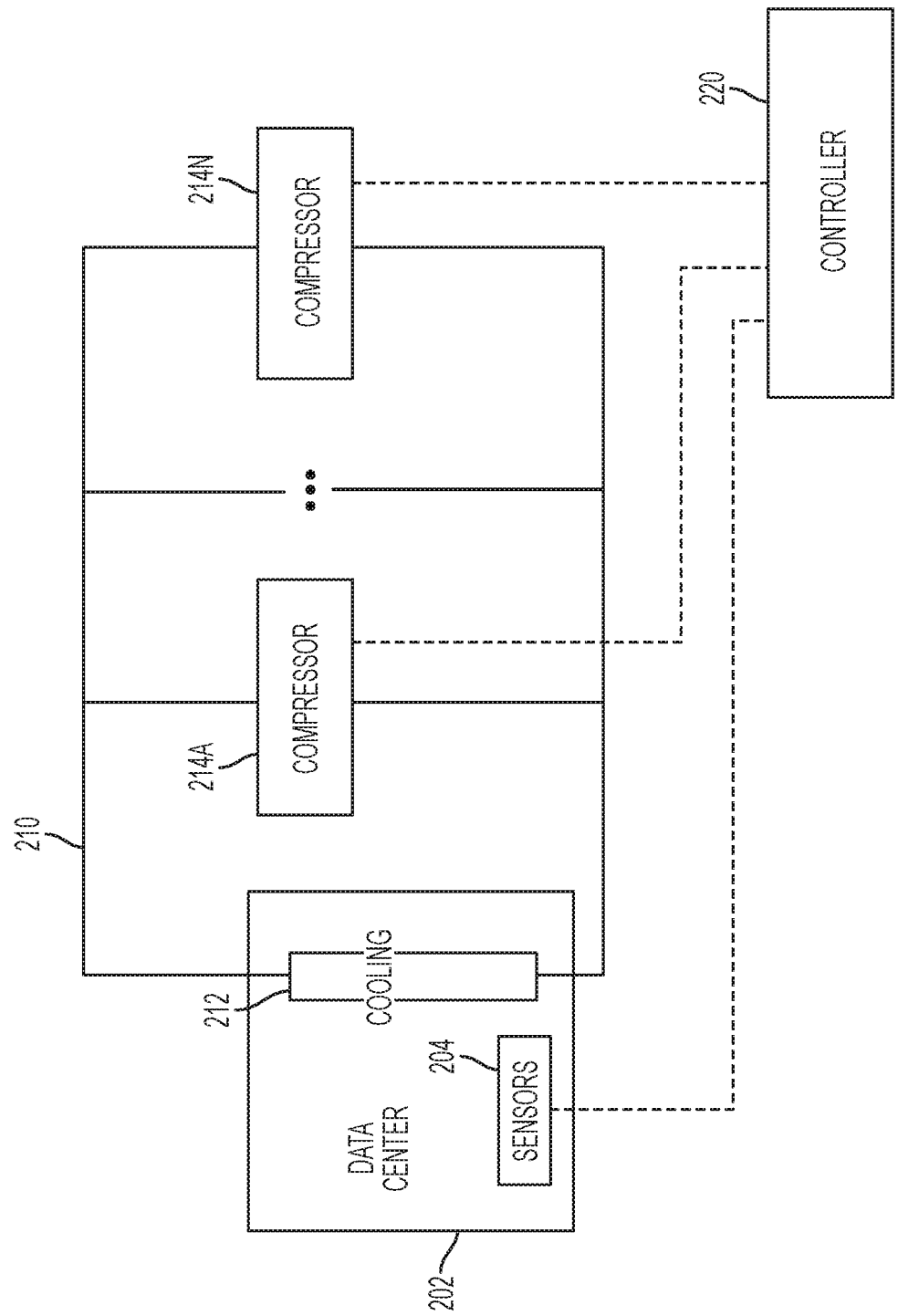
FIG. 2 is a block diagram illustrating a single refrigeration circuit cooling system operated by a controller for cooling a data center according to some embodiments of the disclosure.

FIG. 2 is a block diagram illustrating a single refrigeration circuit cooling system operated by a controller for cooling a data center according to some embodiments of the disclosure. A data center 202 may include a cooling system having interior components 212 coupled to a refrigeration circuit 210 that couples the interior components 212 to compressors 214A-N. The data center 202 is a confined space that may have a controlled temperature and/or humidity, in which the control is obtained through the cooling system attached to the confined space. Although a data center is described throughout examples provided in this application, aspects of the cooling systems described herein can be implemented in any confined space, such as buildings, houses, automobile cabins, and the like. Aspects of the cooling systems can also be applied to cooling of non-confined spaces, although control of temperature and/or humidity may be more difficult to achieve. Although two compressors 214A and 214N are shown, any number of compressors may be coupled in parallel on the refrigeration circuit 210, and the compressors 212A-N may be compressors with identical capacities or compressors with different capacities.

A controller 220 may be coupled to the compressors 214A-N and configured to activate, de-activate, and adjust operating speeds of each of the compressors 214A-N. Individual control over each of the compressors 214A-N may allow for efficient operation of the cooling system by controlling the capacity (e.g., loading/unloading and speed) of individual compressors within its operational limits for efficient operation. The controller 220 may receive input from sensors 204 within the data center 202, which may provide an indication of an indoor temperature and/or humidity within the data center 202. This indication may be understood as indicating a desired cooling load when the sensor data compared with a user-programmed desired temperature. That is, when the controller 220 is programmed to maintain 68 degrees Fahrenheit and the indoor temperature is indicated as 70 degrees Fahrenheit, the controller 220 may trigger a request indicating a desired cooling load sufficient to reduce the temperature of the data center 202 to the programmed temperature. The user-programmed temperature may be received through a user interface during setup of the data center 202 or during operation of the data center 202. Further, the user-programmed temperature may be received through a local terminal, such as a keyboard and monitor within the data center 202, or through a remote terminal, such as an administrator's mobile phone, tablet computer, laptop computer, or other computing device.

After receiving the indication of a desired cooling load, the controller 220 may examine pre-programmed information regarding each of the compressors 214A-N to determine a configuration for the compressors 214A-N, such as which compressors to activate and at what speed to operate the activated compressors. The determined configuration of the compressors 214A-N may be selected to achieve an optimum ratio of power consumption to cooling load. In some embodiments, the controller 220 may be preprogrammed with, for example, the curve 104 of FIG. 1 as customized for the cooling system of FIG. 2. When the desired cooling load indication is received, the controller 220 may access the curve 104 and data stored with the curve 104 to determine a configuration for the compressors 214A-N to achieve the ratio of power consumption to cooling load shown on the curve 104. The controller 220 may then issue commands to each of the compressors 214A-N to provide the desired cooling load within the data center 202. Some example methods for controlling the compressors 214A-N are described with reference to FIG. 3 and FIG. 4 below.

To maintain efficient operation of compressors, the compressor speed should only be controlled within a certain speed range. When controlling the compressors, the speed of the compressor should not drop below a minimum speed, even though the cooling load may be less than the cooling capacity of the compressor at the minimum speed. However, compressors can be staged on so that all compressors are operating within their efficient speed range to reduce the step function curve, shown as line 102 of FIG. 1, to a more linear curve, shown as line 104 of FIG. 1. In one embodiment, this efficiency may be achieved by activating a second compressor before a first compressor exceeds its efficient operating range. When the second compressor is activated, the first compressor may be reduced in speed to an output level within its efficient operating range and the second compressor increased in speed to operate at a speed within its efficient operating range. Thus, both of the first and second compressors are operated in their efficient operating range. An example method executed by the controller 220 according to such a technique is described with reference to FIG. 3.

Figure 3:
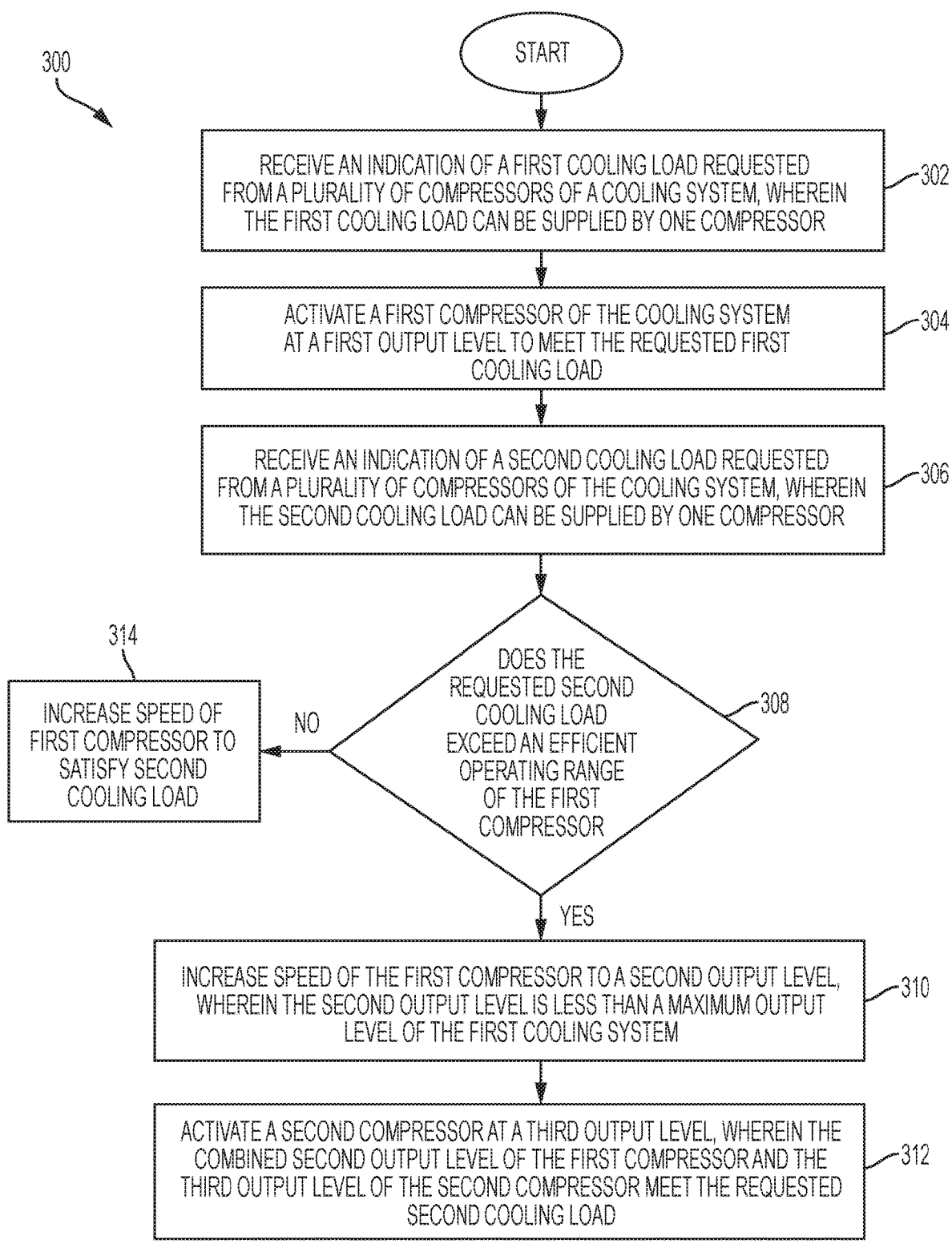
FIG. 3 is a flow chart illustrating an example method of operating a cooling system according to some embodiments of the disclosure.

FIG. 3 is a flow chart illustrating an example method of operating a cooling system according to some embodiments of the disclosure. A method 300 may begin at block 302 with receiving an indication of a first cooling load requested from a plurality of compressors of a cooling system, wherein the first cooling load can be supplied by one compressor. At block 304, a first compressor is activated at a first output level to meet the requested first cooling load.

Over time, the heat load within a data center may increase, such as during peak Internet traffic hours, such that additional cooling is required within the data center. At block 306, an indication for a request of a second cooling load is received, in which the second cooling load could be supplied by the first compressor activated at block 304. However, the controller 220, in determining an efficient configuration for the cooling system, may perform certain calculations using preprogrammed information regarding the compressors and instead activate additional compressors to improve efficiency. For example, at block 308, it is determined whether the requested second cooling load exceeds an efficient operating range of the first compressor. If so, the method 300 may proceed to block 310 to increase the speed of the first compressor to a second output level, wherein the second output level is less than a maximum output level of the first cooling system, and wherein the second output level may be within an efficient operating range of the first compressor. Then, at block 312, the controller may activate a second compressor at a third output level, wherein the combined second output level of the first compressor and the third output level of the second compressor are sufficient to satisfy the requested second cooling load, and wherein the third output level of the second compressor may be within an efficient operating range of the second compressor. If the second cooling load of block 306 is determined at block 308 to be within the efficient operating range of the first compressor, the method 300 may instead proceed to block 314 to increase speed of the first compressor to satisfy the requested second cooling load.

Figure 4:
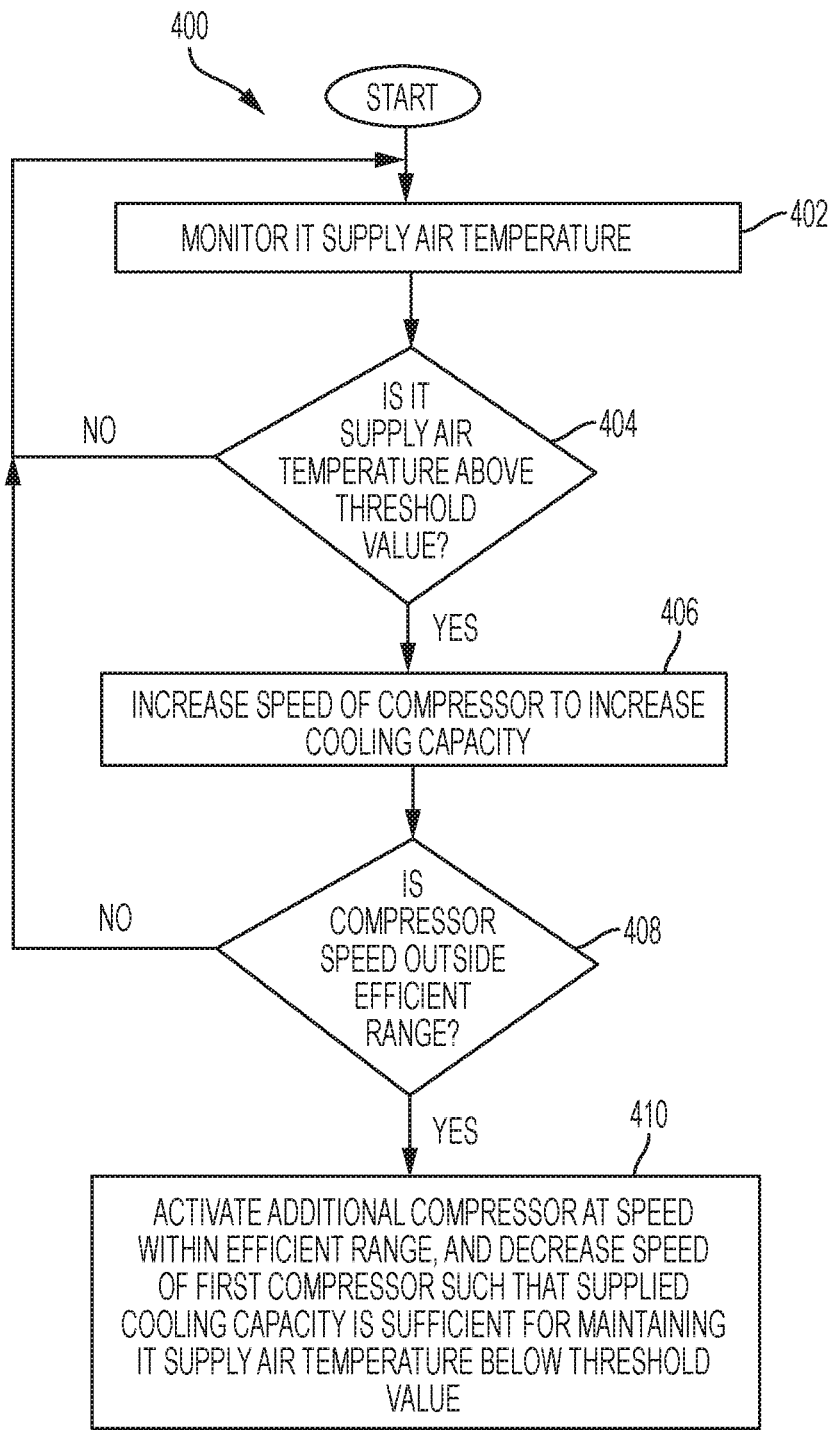
FIG. 4 is a flow chart illustrating an example method of operating a cooling system to achieve power consumption that is approximately linear with varying cooling load according to some embodiments of the disclosure.

Another example of a method for controlling compressors in a cooling system according to one embodiment of the disclosure is described with reference to FIG. 4. FIG. 4 is a flow chart illustrating an example method of operating a cooling system to achieve power consumption that is approximately linear with varying cooling load according to some embodiments of the disclosure. A method 400 may begin at block 402 with monitoring an IT supply air temperature within a data center. At block 404, the IT supply air temperature is compared with a threshold value to determine if additional cooling is required in the data center. If additional cooling is required, the method 400 continues to block 406 to increase the speed of an operating compressor to increase available cooling capacity and reduce the IT supply air temperature to below the threshold value. Then, at block 408, it is determined if the speed is or would cause the compressor to go outside an efficient operating range. If so, the method 400 proceeds to block 410, where an additional compressor is activated to reduce some cooling load on the first compressor of block 406. The additional compressor may be activated at a speed within its efficient operating range. When the low point of the efficient operating range for the additional compressor provides more cooling capacity than required, the first compressor speed may be reduced to return the first compressor to its efficient operating range. When the low point of the efficient operating range for the additional compressor does not provide sufficient cooling capacity, the starting speed of the additional compressor may be increased until the required cooling capacity is achieved. The starting speed of the additional compressor may be further increased to obtain sufficient cooling capacity such that the first compressor may be reduced in speed back to an efficient operating range.

Figure 5:
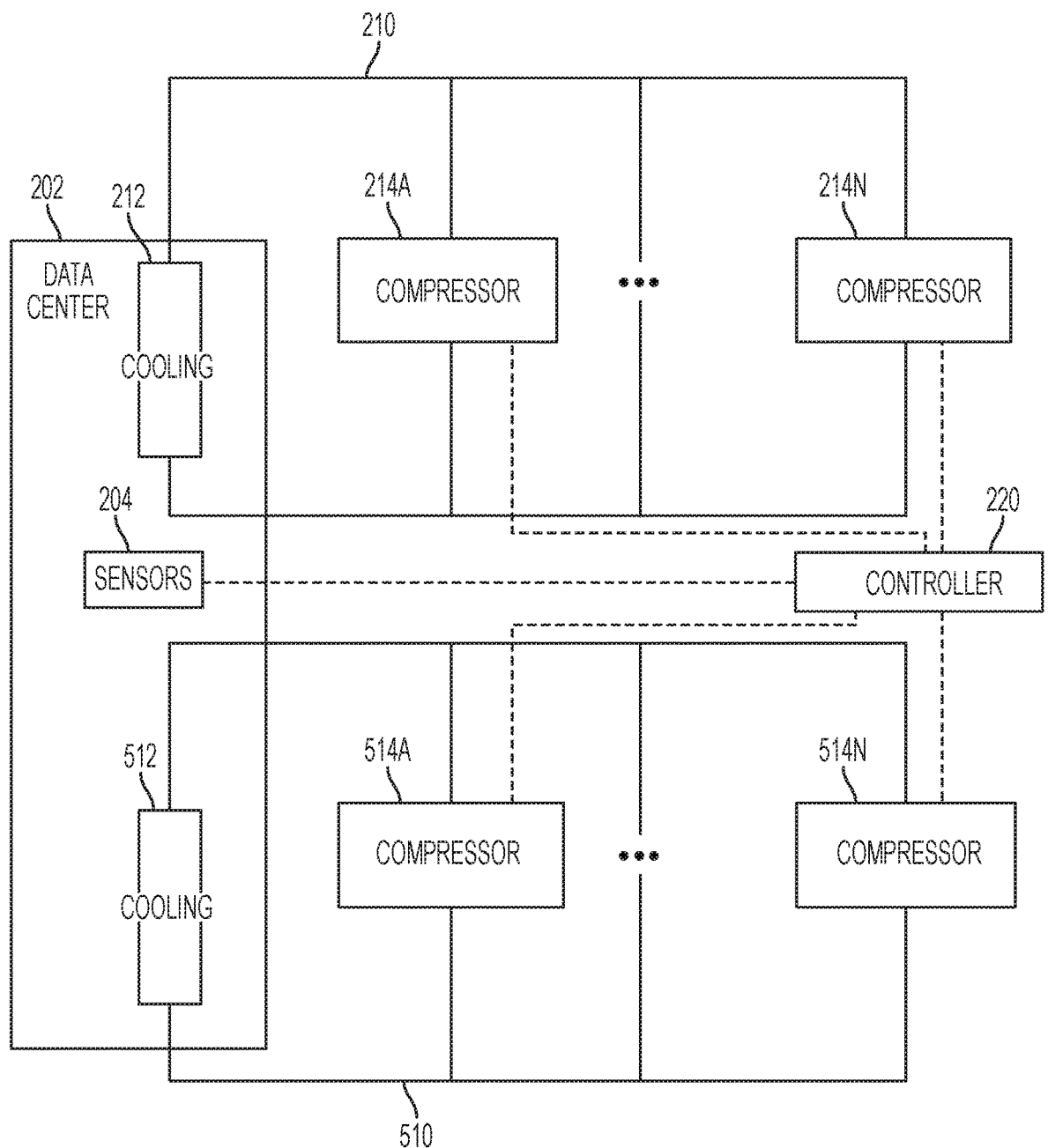
FIG. 5 is a block diagram illustrating multiple refrigeration circuits of a cooling system controlled to provide efficient power consumption with varying cooling load according to some embodiments of the disclosure.

Multiple refrigeration circuits may be used to increase the capacity range of a cooling system from that of the single refrigeration circuit shown in FIG. 2. A similar configuration with multiple refrigeration circuits is shown in FIG. 5. FIG. 5 is a block diagram illustrating multiple refrigeration circuits of a cooling system controlled to provide efficient power consumption with varying cooling load according to some embodiments of the disclosure. The data center 202 may include additional internal cooling components 512 coupled to a second refrigeration circuit 510. Although internal components 512 are shown separate from internal components 212, in some embodiments the internal components 212 may be shared between the first refrigeration circuit 210 and the second refrigeration circuit 510. Further, although only two refrigeration circuits 210 and 510 are shown, additional refrigeration circuits may be coupled and operated in a similar manner as shown and described. For example, the controller 220 may control each of the circuits 210 and 510 such that multiple circuits may be active at the same time, while controlling each of the compressors 214A-N and 514A-N to be within an efficient operating range. In some embodiments, some of the compressors 214A-N and 514A-N may be packaged into a single unit. By placing multiple circuits 210 and 510 in parallel, the capacity range of the cooling system may be expanded and/or the linearity of loading-unloading efficiency curve of line 104 of FIG. 1 may be improved. When the controller 220 receives a request indicating a desired cooling load, the controller 220 may determine a configuration of the circuits 210 and 510 and accompanying compressors 214A-N and 514A-N to obtain the desired cooling load in an efficient manner by adjusting speeds of the individual compressors 214A-N and 514A-N.

Figure 7:
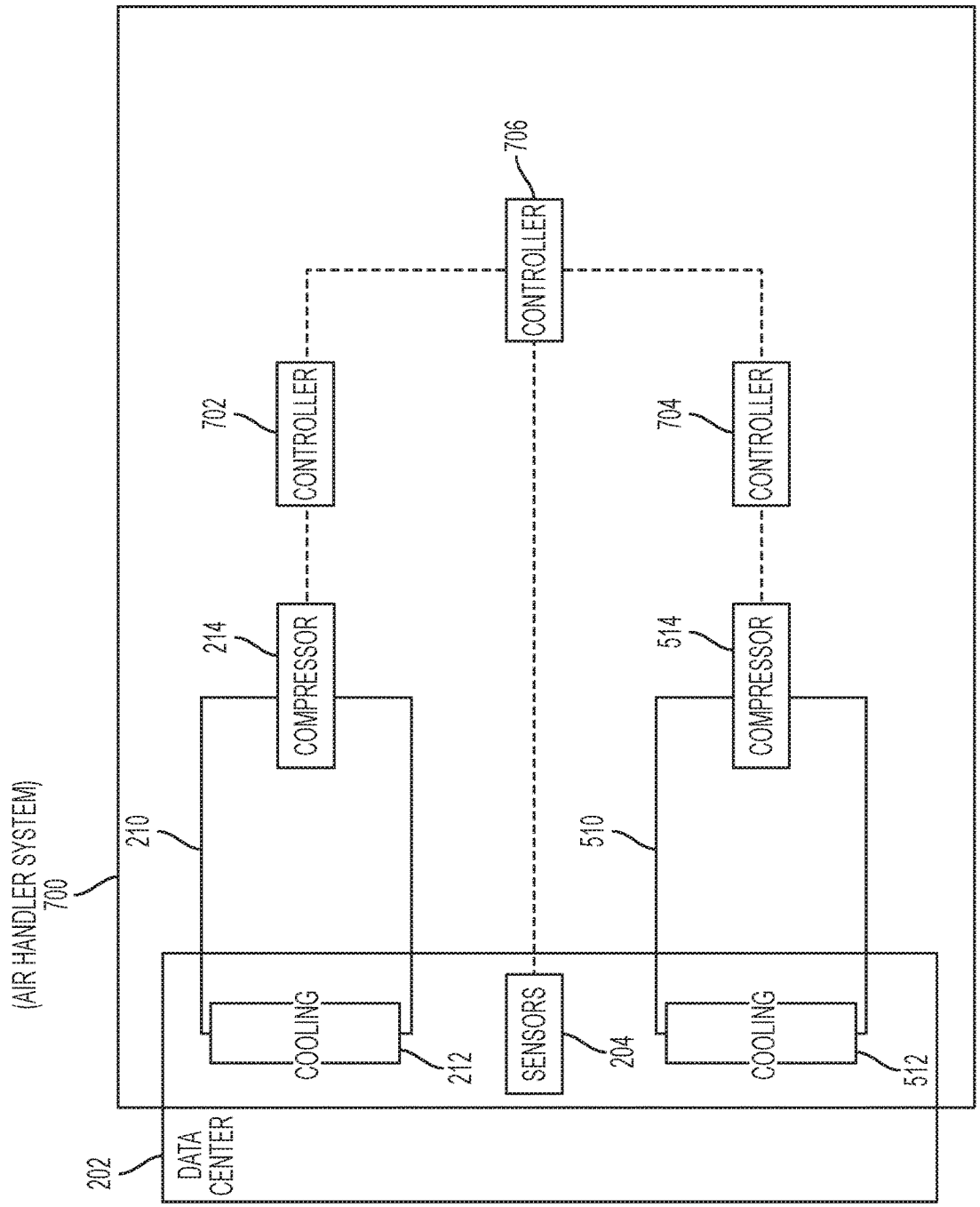
FIG. 7 is a block diagram illustrating multiple independent refrigeration circuits of an air handler system controlled to provide fail-on functionality.

Multiple refrigeration circuits may be used to allow a fail-on operation in an air handling system. The fail-on operation may be provided by redundant refrigeration circuits to allow for operational continuity in case of a failure of one or more refrigeration circuits of the air handler system. A configuration of a system with multiple independent refrigeration circuits of an air handler system 700 is shown in FIG. 7. FIG. 7 is a block diagram illustrating multiple independent refrigeration circuits 210 and 510 of an air handler system 700 connected in parallel to provide fail-on cooling continuity in the event of a failure of one or more refrigeration circuits 210 and 510. Although only two circuits are shown in FIG. 7, additional circuits may be present, such as three, four, or more. Controllers 702 and 704 may control operation of the circuits 210 and 510, respectively, within the air handler system 700. The air handler system 700 may be housed within a single casing.

An enclosed space, such as data center 202, being cooled by the air handler system may contain multiple cooling components for cooling or otherwise conditioning the enclosed space. The multiple cooling components may be coupled to multiple refrigeration circuits. For example, a first cooling component 212 may be coupled to a first refrigeration circuit 210 and a second cooling component 512 may be coupled to a second refrigeration circuit 510. The first refrigeration circuit 210 may include a first compressor 214 and a first controller 702 configured to control the first compressor 214, and the second refrigeration circuit 510 may include a second compressor 514 and a second controller 704 configured to control the second compressor 514. Alternatively, each refrigeration circuit may use evaporative cooling equipment in place of or in conjunction with compressors. Some refrigeration circuits may contain a plurality of compressors, each controlled by the controller of the respective refrigeration circuit. A primary controller 706 may be configured to control the first refrigeration circuit 210 and the second refrigeration circuit 510 by controlling the first controller 702 and the second controller 704. The primary controller 706 may be configured to monitor a temperature and/or humidity of an enclosed space regulated by the air handler system 700 and to detect a failure in a first refrigeration circuit 210 or any refrigeration circuit of the plurality of refrigeration circuits. Additional refrigeration circuits of the air handler system may be configured similarly.

In some embodiments, the first refrigeration circuit 210 and the second refrigeration circuit 510 may be independent of each other apart from primary controller 706 directing the operation of the two, or more, independent refrigeration circuits 210 and 510. For example, the refrigeration circuits 210 and 510 may be independent parallel piping systems such that a failure in one piping system does not impede functionality of the remaining refrigeration circuits. In the same way, the first controller 702 and the second controller 704 may function independently of one another such that a failure of one does not impede the performance of the other.

Figure 8:
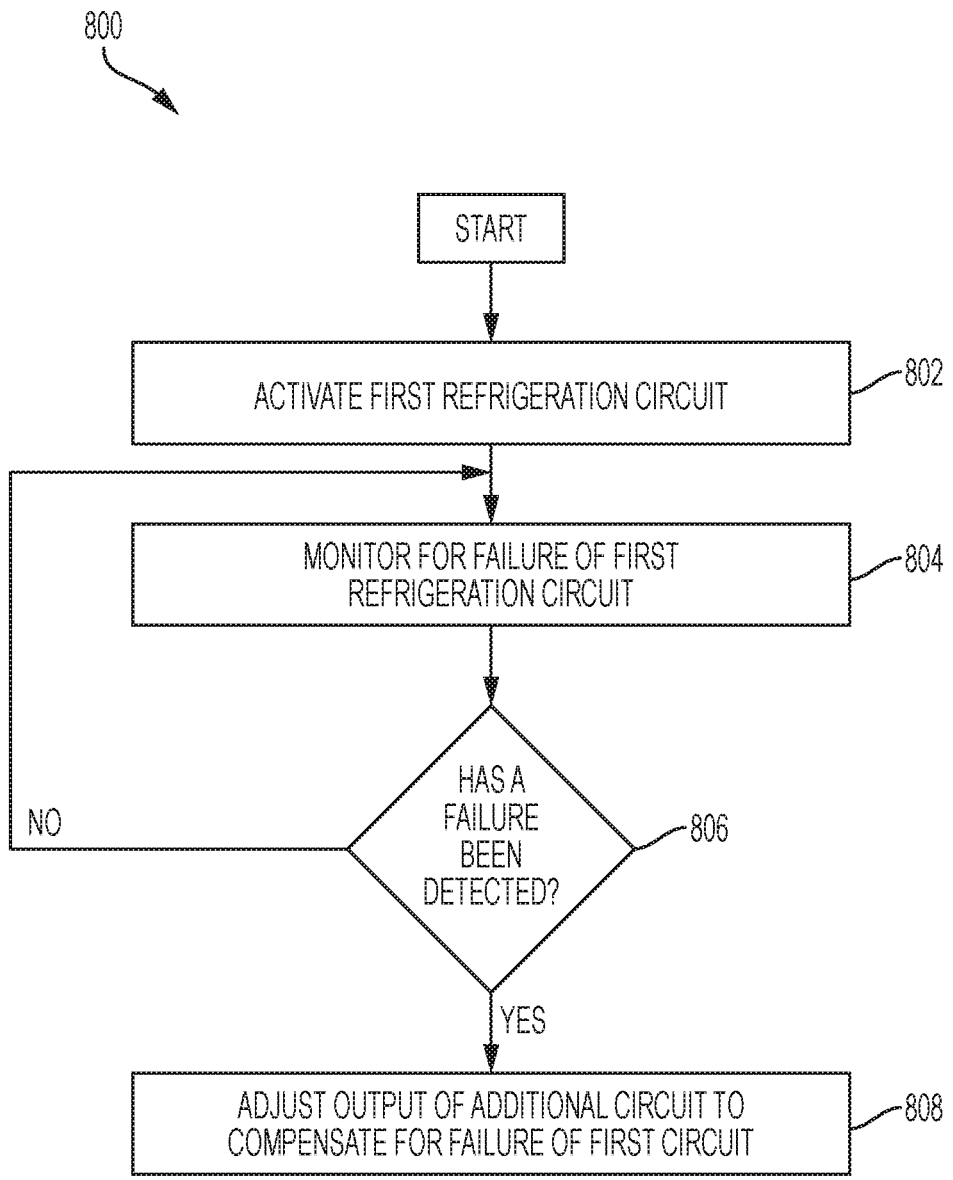
FIG. 8 is a flow chart illustrating an example method of operating a fail-on cooling system containing a plurality of independent refrigeration circuits.

FIG. 8 illustrates an example of a method for controlling refrigeration circuits in a fail-on cooling system according to one embodiment of the disclosure. FIG. 8 is a flow chart illustrating an example method of operating a fail-on cooling system with redundant refrigeration circuits to achieve, for example, greater temperature stability in the event of a fault in a cooling circuit according to some embodiments of the disclosure. The method 800 be may performed by the primary controller 706. The method 800 may begin at block 802 with activating a first refrigeration circuit. The first refrigeration circuit 210 may be one of a plurality of independent refrigeration circuits connected in parallel in the air handler system 700. The primary controller 706 may control activation of the first refrigeration circuit 210 by controlling a first controller 702 of the first refrigeration circuit 210. At block 804, the first refrigeration circuit is monitored for a failure. In some cases, such a failure may occur within circuit piping, the cooling component 212 such as a condenser, the compressor 214, an evaporative cooling component, or the controller 702. The detection of a failure may be performed by the primary controller 706 or the first controller 702 of the first refrigeration circuit 210. For example, the primary controller 706 may directly monitor conditions of the first refrigeration circuit 210 and compare those conditions to predetermined limits. As another example, the primary controller 706 may detect a failure by receiving a warning message from the first controller 702. As yet another example, the primary controller 706 may detect a failure by losing communication with the first controller 702. Alternatively, a failure of the first circuit 210 may be detected by a controller of an additional refrigeration circuit, such as the second controller 704 of the second refrigeration circuit 510. At block 806, a determination is made if a failure was detected during the monitoring of block 804. If a failure is detected, the method 800 moves to block 808 where an output of an additional refrigeration circuit is adjusted to compensate for the failure of the first refrigeration circuit 210. The additional refrigeration circuit may be the second refrigeration circuit 510 or another refrigeration circuit of a plurality of independent parallel refrigeration circuits of the air handler system. The output of the additional refrigeration circuit may be adjusted to satisfy a full load or at least a portion of a load that was satisfied by the first refrigeration circuit 210 prior to failure. The adjustment may be performed by the primary controller 706 directing operation of the second controller 704. If no failure is detect at block 806, the method 800 returns to block 804 to continue monitoring for failures.

In some embodiments, the additional refrigeration circuit may be held in a deactivated or standby mode until a failure is detected. In such a case, adjusting the output of the additional refrigeration circuit may include activating the additional refrigeration circuit. In other cases, the additional refrigeration circuit may already be operating with the first refrigeration circuit 210 to cool an enclosed space, such as a data center of an information handling system. In such operation, a load placed on the additional refrigeration circuit may be increased to compensate for the failure of the first refrigeration circuit 210.

In certain embodiments, the method may include balancing a cooling load across a plurality of compressors located on a plurality of refrigeration circuits in an efficient operating range. Such balancing may be performed by a primary controller 706 directing the operation of controllers of independent refrigeration circuits, such as the first controller 702 and the second controller 704. When a failure is detected, the load may be increased on the remaining refrigeration circuits in which a failure has not been detected to compensate for the failure. The load balancing may be performed in a way that maintains the operation of the remaining refrigeration circuits as close to an efficient operating range as possible. In certain embodiments, a load may be balanced across a plurality of independent refrigeration circuits of an air handler system while maintaining at least one independent refrigeration circuit in a deactivated state until a failure has been detected. When an error condition of the first refrigeration circuit is resolved, such as by repairing faulty equipment or determining the error was a false positive, the first refrigeration circuit may be re-activated and loads balanced to obtain efficient operation.

The controllers 220, 702, 704, and 706 or other hardware or software configured to perform the control methods described herein may be integrated into a programmable logic controller (PLC). The PLC may be, for example, generic logic circuitry, such as a personal computer (PC), or dedicated circuitry, such as an application-specific integrated circuit (ASIC). The PLC may be integrated into a data center. Although many arrangements for data centers are known and capable of operating with a cooling system, such as the cooling system embodiments described above, one example of a data center is a modular data center. Details regarding a modular data center are described in U.S. patent application Ser. No. 15/182,409 filed on Jun. 14, 2016 and entitled "Modular Data Center with Utility Module," which is incorporated by reference. A PLC integrated with a modular data center is shown in FIG. 6.

Figure 6:
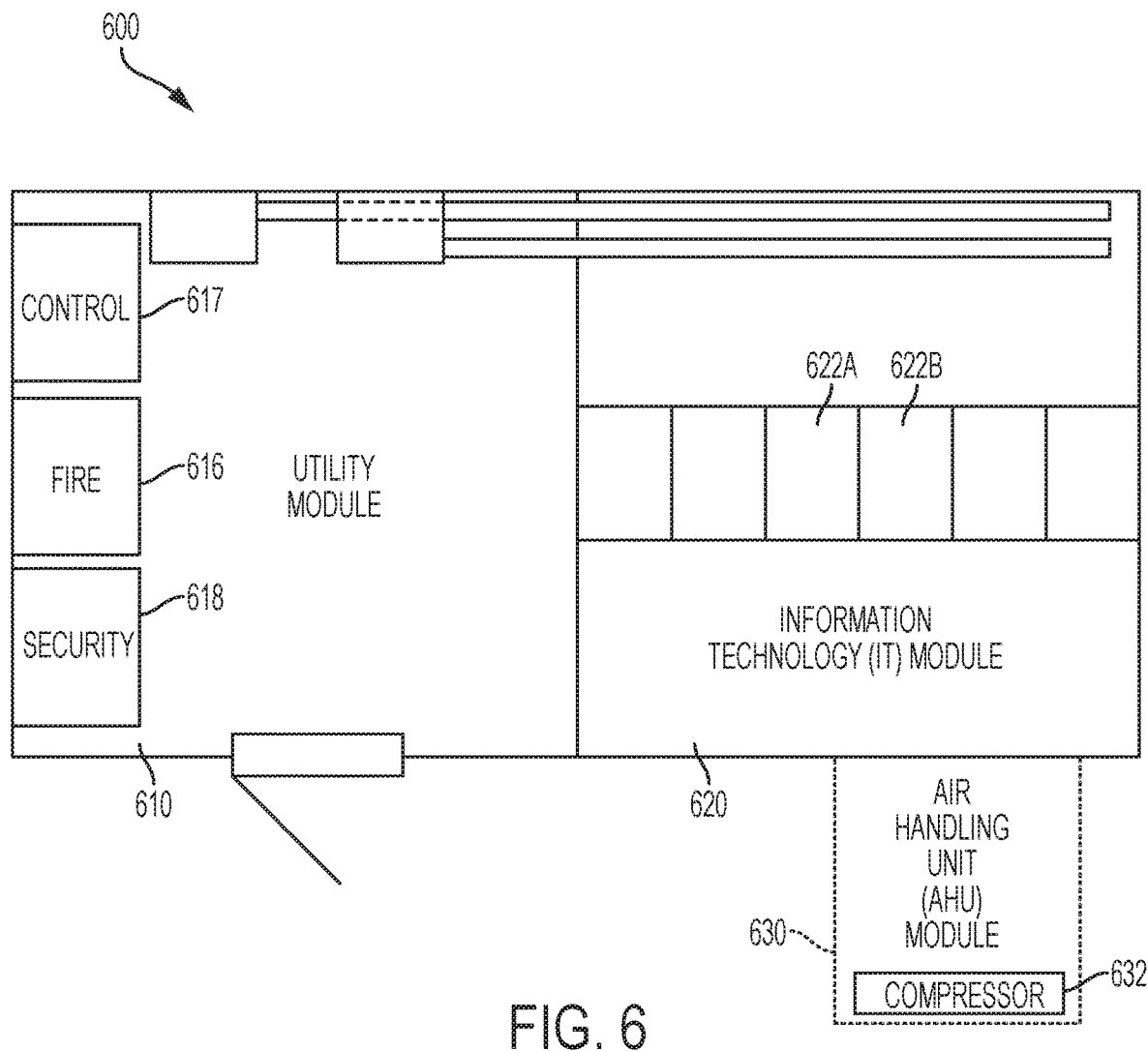
FIG. 6 is a block diagram illustrating a programmable logic controller (PLC) for a data center integrated with the data center and coupled to communicate with the cooling system according to some embodiments of the disclosure.

FIG. 6 is a block diagram illustrating a programmable logic controller (PLC) for a data center integrated with the data center and coupled to communicate with the cooling system according to some embodiments of the disclosure. A modular data center 600 may house an information handling system in several modules. A utility module 610 may be connected to an information technology (IT) module 620, which is connected to an air handling unit (AHU) module 630. The IT module 620 may include racks 622 (e.g., racks 622A and 622B) that house computer systems, network equipment, other electronic equipment configured to compute, calculate, determine, classify, process, transmit, receive, retrieve, originate, switch, store, display, communicate, manifest, detect, record, reproduce, handle, or utilize any form of information, intelligence, or data for business, scientific, control, or other purposes, and electronic equipment that supports these systems. The space within IT module 620 may be conditioned to desired temperature and humidity levels by an air handling unit (AHU) module 630. The AHU module 630 may include a cooling system, such as a direct cooling or evaporative cooling system, and/or a mixing chamber for mixing cooled air, return air, and/or outside air to obtain the desired temperature and humidity levels. In some embodiments, the AHU module 630 may include compressors 632, which may be configured as shown in FIG. 2, FIG. 5, or FIG. 7.

Equipment in the IT module 620 and the AHU module 630 may be supported by utility infrastructure and other equipment inside a utility module 610. For example, the utility module 610 may include utility infrastructure such as a fire suppression system 616, a control system 617, and/or a security system 618. The utility module 610 and the IT module 620, or other modules not shown, may include connections that allow the modules to be placed next to each other on a site location and quickly connected. The connections may be standardized common ports that accept a cable for connecting to another module, in which the cable may include several sub-cables or sub-connections that provide access to shared functions from other modules, such as power and data connectors. Thus, the modules may be quickly connected together without modifying equipment contained within the utility module 610 and the IT module 620. The fire suppression system 616, the control system 617, and the security system 618, may be coupled to these connections from the utility module 610 to the IT module 620.

The control system 617 may include, for example, a server system and/or a programmable logic controller (PLC) configured to support the data center 600. For example, the control system 617 may monitor a status of utility infrastructure, including power sources, and may monitor a status of security systems 618, including recording surveillance video and logging access to secure areas. The control system 617 may also include alerting functionality to alert an administrator through messages, such as e-mail messages or text messages, regarding status updates based on predefined rules and/or when errors occur. The control system 617 may further control the AHU module 630, including compressors 632, according to methods described herein and methods illustrated in FIG. 3, FIG. 4, and FIG. 8.

In one embodiment, the control system 617 may control the compressors 632 through an EtherCAT or analog/digital two-wire signal, although other communication protocols are also possible. The control system 617 may implement a closed-loop control method based, in part or in whole, on IT supply air temperature as the input and a desired temperature value to be maintained. If the IT supply air temperature increases, a compressor's speed may be increased and/or more compressor(s) or refrigeration circuits may be activated. If IT supply air temperature decreases, a compressor's speed may be decreased and/or more compressor(s) or refrigeration circuits may be de-activated.

The schematic flow chart diagrams of FIG. 3, FIG. 4, and FIG. 8 are generally set forth as logical flow chart diagrams. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a plurality of independent refrigeration circuits in an air handler system; and
a primary controller configured to control the plurality of independent refrigeration circuits,
wherein the primary controller is configured to perform steps comprising:
activating a first refrigeration circuit of the plurality of independent refrigeration circuits of the air handler system at a first output level;
detecting a failure of the first refrigeration circuit; and
after the failure is detected, adjusting an output of a second refrigeration circuit of the plurality of independent refrigeration circuits of the air handler system to compensate for the failure of the first refrigeration circuit and satisfy at least a portion of a load that was satisfied by the first refrigeration circuit prior to the failure,
wherein the first refrigeration circuit comprises a first compressor and a first controller configured to control the first compressor and the second refrigeration circuit comprises a second compressor and a second controller configured to control the second compressor,
wherein the first controller and the second controller are independent of each other, and wherein the primary controller separately controls operation of the first controller and the second controller via separate connections between the primary controller and the first controller and the primary controller and the second controller,
wherein detecting a failure of the first refrigeration circuit comprises detecting, by the primary controller, a failure of communication between the primary controller and the first controller, and
wherein adjusting the output of the second refrigeration circuit comprises adjusting, by the primary controller, operation of the second controller to compensate for the failure of communication between the primary controller and the first controller.

2. The apparatus of claim 1, wherein refrigeration circuits of the plurality of independent refrigeration circuits are connected in parallel.

3. The apparatus of claim 1, wherein the step of activating the first refrigeration circuit at a first output level comprises receiving an indication of a first cooling load and activating the first compressor at the first output level to meet a demand of the first cooling load.

4. The apparatus of claim 3, wherein the primary controller is further configured to perform steps further comprising:
receiving an indication of a second cooling load that is higher than the first cooling load;
determining that the second cooling load is higher than a cooling capacity of the first compressor of the first refrigeration circuit when operated within a first operating range;
activating the second compressor of the second refrigeration circuit having a second operating range at a second output level within the second operating range; and
adjusting a first speed of the first compressor and a second speed of the second compressor to satisfy the second cooling load while maintaining the first compressor within the first operating range and the second compressor within the second operating range.

5. The apparatus of claim 1, wherein the first refrigeration circuit comprises a first piping system and the second refrigeration circuit comprises a second piping system separate and distinct from the first piping system.

6. The apparatus of claim 1, wherein the step of adjusting the output of the second refrigeration circuit to compensate for the failure of the first refrigeration circuit comprises activating the second refrigeration circuit.

7. The apparatus of claim 1, wherein the first refrigeration circuit comprises a plurality of compressors and the second refrigeration circuit comprises a plurality of compressors.

8. The apparatus of claim 1, wherein the step of activating a first refrigeration circuit at a first output level comprises activating the first refrigeration circuit to meet a cooling demand of a data center of an information handling system.

9. The apparatus of claim 1, wherein detecting a failure of the first refrigeration circuit comprises receiving, by the primary controller, a failure notification from the first controller, and wherein adjusting the output of the second refrigeration circuit comprises adjusting, by the primary controller, operation of the second controller in response to the receipt of the failure notification.

10. A method for controlling, with a primary controller, a plurality of independent refrigeration circuits coupled in parallel in an air handler system and configured to provide cooling to a confined space, the method comprising;
activating a first refrigeration circuit of the plurality of independent refrigeration circuits of the air handler system at a first output level;
detecting a failure of the first refrigeration circuit; and
after the failure is detected, adjusting an output of a second refrigeration circuit of the plurality of independent refrigeration circuits of the air handler system to compensate for the failure of the first refrigeration circuit and satisfy at least a portion of a load that was satisfied by the first refrigeration circuit prior to the failure,
wherein the first refrigeration circuit comprises a first compressor and a first controller configured to control the first compressor and the second refrigeration circuit comprises a second compressor and a second controller configured to control the second compressor,
wherein the first controller and the second controller are independent of each other, and wherein the primary controller separately controls operation of the first controller and the second controller via separate connections between the primary controller and the first controller and the primary controller and the second controller,
wherein detecting a failure of the first refrigeration circuit comprises detecting, by the primary controller, a failure of communication between the primary controller and the first controller, and
wherein adjusting the output of the second refrigeration circuit comprises adjusting, by the primary controller, operation of the second controller to compensate for the failure of communication between the primary controller and the first controller.

11. The method of claim 10, wherein the step of activating the first refrigeration circuit at a first output level comprises receiving an indication of a first cooling load and activating the first compressor at the first output level to meet a demand of the first cooling load.

12. The method of claim 11, further comprising:
receiving an indication of a second cooling load that is higher than the first cooling load;
determining that the second cooling load is higher than a cooling capacity of the first compressor of the first refrigeration circuit when operated within a first operating range;
activating a second compressor of the second refrigeration circuit having a second operating range at a second output level within the second operating range; and
adjusting a first speed of the first compressor and a second speed of the second compressor to satisfy the second cooling load while maintaining the first compressor within the first operating range and the second compressor within the second operating range.

13. The method of claim 10, wherein the step of adjusting the output of the second refrigeration circuit to compensate for the failure of the first refrigeration circuit comprises activating the second refrigeration circuit.

14. The method of claim 10, wherein the step of activating a first refrigeration circuit at a first output level comprises activating the first refrigeration circuit to meet a cooling demand of a data center of an information handling system.

15. The method of claim 10, wherein detecting a failure of the first refrigeration circuit comprises receiving, by the primary controller, a failure notification from the first controller, and wherein adjusting the output of the second refrigeration circuit comprises adjusting, by the primary controller, operation of the second controller in response to the receipt of the failure notification.

16. A cooling system for an information handling system, comprising:
a first independent refrigeration circuit in an air handler system for providing cooling to a data center, comprising:
a first compressor; and
a first controller configured to control the first compressor; and
a second independent refrigeration circuit in the air handler system for providing cooling to a data center, comprising:
a second compressor; and
a second controller configured to control the second compressor; and
a primary controller configured to control the first and second controllers,
wherein the primary controller is configured to perform steps comprising:
activating the first independent refrigeration circuit of the air handler system at a first output level;
detecting a failure of the first independent refrigeration circuit of the air handler system; and
after the failure is detected, adjusting an output of the second independent refrigeration circuit of the air handler system to compensate for the failure of the first independent refrigeration circuit of the air handler system and satisfy at least a portion of a load that was satisfied by the first independent refrigeration circuit of the air handler system,
wherein the first controller and the second controller are independent of each other, and wherein the primary controller separately controls operation of the first controller and the second controller via separate connections between the primary controller and the first controller and the primary controller and the second controller,
wherein detecting a failure of the first refrigeration circuit comprises detecting, by the primary controller, a failure of communication between the primary controller and the first controller, and
wherein adjusting the output of the second refrigeration circuit comprises adjusting, by the primary controller, operation of the second controller to compensate for the failure of communication between the primary controller and the first controller.

17. The cooling system of claim 16, wherein the step of activating the first independent refrigeration circuit of the air handler system at a first output level comprises receiving an indication of a first cooling load and activating the first compressor at the first output level to meet a demand of the first cooling load.

18. The cooling system of claim 17, wherein the primary controller is further configured to perform steps comprising:
receiving an indication of a second cooling load that is higher than the first cooling load;
determining that the second cooling load is higher than a cooling capacity of the first compressor when operated within a first operating range;
activating a second compressor of the second independent refrigeration circuit of the air handler system having a second operating range at a second output level within the second operating range; and
adjusting a first speed of the first compressor and a second speed of the second compressor to satisfy the second cooling load while maintaining the first compressor within the first operating range and the second compressor within the second operating range.

* * * * *